US012737863B2

(12) United States Patent
Yoshiyama et al.

(10) Patent No.: US 12,737,863 B2
(45) Date of Patent: Sep. 15, 2026

(54) ELECTRONIC DEVICE AND METHOD OF MEASURING BLUR INFORMATION THEREOF

(71) Applicant: Samsung Display Co., LTD., Yongin-si (KR)

(72) Inventors: Masahiko Yoshiyama, Yokohama (JP); Yasuhiko Shinkaji, Yokohama (JP)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 364 days.

(21) Appl. No.: 18/384,914

(22) Filed: Oct. 30, 2023

(65) Prior Publication Data

US 2024/0242322 A1 Jul. 18, 2024

(30) Foreign Application Priority Data

Jan. 17, 2023 (KR) ........................ 10-2023-0006619

(51) Int. Cl.

*G06T 7/00* (2017.01)
*H04N 23/50* (2023.01)
*H04N 23/62* (2023.01)
*H04N 23/76* (2023.01)
*H04N 23/81* (2023.01)
(Continued)

(52) U.S. Cl.

CPC ........... *G06T 7/0002* (2013.01); *H04N 23/50* (2023.01); *H04N 23/76* (2023.01); *H04N 23/81* (2023.01); *G06T 2207/10152* (2013.01); *G06T 2207/20092* (2013.01); *G06T 2207/30168* (2013.01);
(Continued)

(58) Field of Classification Search

CPC ......... G06T 7/0002; G06T 2207/10152; G06T 2207/20092; G06T 2207/30168; H04N 23/50; H04N 23/76; H04N 23/81; H04N 23/62; H01L 25/167; H10F 39/198; H10K 59/65
See application file for complete search history.

(56) References Cited

U.S. PATENT DOCUMENTS 10,303,921 B1 * 5/2019 He ...................... G02F 1/13318
12,431,473 B2 * 9/2025 Lee ...................... H10H 20/831
(Continued)

FOREIGN PATENT DOCUMENTS

JP H09257699 A 10/1997
JP 2856609 B2 2/1999
JP 2022101012 A * 7/2022

*Primary Examiner* — Ming Y Hon
*Assistant Examiner* — Dominique James
(74) *Attorney, Agent, or Firm* — CANTOR COLBURN LLP

(57) ABSTRACT

An electronic device includes a display module, an optical sensing module, a protective film, and a control module. The display module includes a display area, through which an image is displayed, and a peripheral area defined adjacent to the display area. The optical sensing module is disposed under the display module and receives an optical signal via the display module. The protective film is disposed on the display module. The control module includes a blur-measuring unit which compares a first image obtained using the optical sensing module before the protective film is attached to the display module with a second image obtained using the optical sensing module after the protective film is attached to the display module to calculate blur information included in the second image.

17 Claims, 13 Drawing Sheets

(51) Int. Cl.
*H10F 39/12* (2025.01)
*H10K 59/65* (2023.01)
*H10W 90/00* (2026.01)

(52) U.S. Cl.
CPC ............ *H04N 23/62* (2023.01); *H10F 39/198* (2025.01); *H10K 59/65* (2023.02); *H10W 90/00* (2026.01)

(56) References Cited

U.S. PATENT DOCUMENTS

| | | | | |
|---|---|---|---|---|
| 2013/0063978 | A1* | 3/2013 | Gettemy | G02B 6/0088 362/609 |
| 2013/0162697 | A1* | 6/2013 | Kobayashi | G09G 3/3614 345/87 |
| 2014/0063413 | A1* | 3/2014 | Kim | G02B 6/0035 349/61 |
| 2017/0220838 | A1* | 8/2017 | He | G06F 3/0412 |
| 2017/0357344 | A1* | 12/2017 | Hong | G06F 3/0447 |
| 2019/0087630 | A1* | 3/2019 | Seo | G06V 40/1329 |
| 2020/0052048 | A1* | 2/2020 | Kuo | G06F 1/1605 |
| 2021/0271295 | A1* | 9/2021 | Li | H04M 1/026 |
| 2021/0272256 | A1* | 9/2021 | Okano | G06T 7/11 |
| 2022/0075984 | A1* | 3/2022 | Chan | G06T 1/0007 |
| 2022/0351540 | A1* | 11/2022 | Hai | H10K 59/124 |
| 2023/0049191 | A1* | 2/2023 | Jota | H04N 23/6812 |
| 2024/0027357 | A1* | 1/2024 | Kurashige | G01N 21/8422 |
| 2024/0054200 | A1* | 2/2024 | Zhang | G06F 3/021 |
| 2024/0219765 | A1* | 7/2024 | Yang | G02F 1/1335 |

* cited by examiner

ELECTRONIC DEVICE AND METHOD OF MEASURING BLUR INFORMATION THEREOF

This application claims priority to Korean Patent Application No. 10-2023-0006619, filed on Jan. 17, 2023, and all the benefits accruing therefrom under 35 U.S.C. § 119, the content of which in its entirety is herein incorporated by reference.

BACKGROUND

1. Field

The disclosure relates to an electronic device and a method of measuring blur information thereof. More particularly, the disclosure relates to an electronic device capable of measuring blur information and a method of measuring the blur information of the electronic device.

2. Description of the Related Art

A display device typically includes various electronic components, such as a display module for displaying an image and an electro-optical module. The electronic components may be electrically connected to each other by signal lines arranged in various ways. The electro-optical module may include a camera, an infrared sensor, a proximity sensor, or the like.

The electro-optical module may be disposed under the display module. The display module includes an active area through which the image is displayed and a peripheral area defined adjacent to the active area. The electro-optical module may be disposed under the peripheral area.

SUMMARY

The disclosure provides an electronic device capable of measuring blur information and compensating for blurs of an image obtained by using an optical sensor.

The disclosure provides a method of measuring the blur information of the electronic device.

Embodiments of the invention provide an electronic device including a display module, an optical sensing module, a protective film, and a control module. In such embodiments, the display module includes a display area, through which an image is displayed, and a peripheral area defined adjacent to the display area. In such embodiments, the optical sensing module is disposed under the display module and receives an optical signal via the display module. In such embodiments, the protective film is disposed on the display module. In such embodiments, the control module includes a blur-measuring unit that compares a first image obtained using the optical sensing module before the protective film is attached to the display module with a second image obtained using the optical sensing module after the protective film is attached to the display module to calculate blur information included in the second image.

Embodiments of the invention provide a method of measuring blur information of an electronic device. In such an embodiment, the method includes placing a display module including a display area, through which an image is displayed, and a peripheral area defined adjacent to the display area, obtaining a first image with respect to a measurement area of the display module using an optical sensing module disposed under the display module, placing a protective film on the display module, obtaining a second image with respect to the measurement area using the optical sensing module in a state where the protective film is attached to the display module, and comparing the second image with the first image to calculate the blur information included in the second image.

According to embodiments of the invention, the electronic device compares the first image obtained before the protective film is attached to the display module with the second image obtained after the protective film is attached to the display module to measure the level of blur (i.e., blur information). Accordingly, the image obtained by sensing a sensing target through the optical sensors is compensated for using the blur information, the image from which the blur is removed is generated, and thus, the sensing accuracy of the optical sensors is improved.

BRIEF DESCRIPTION OF THE DRAWINGS

The above and other features of the disclosure will become readily apparent by reference to the following detailed description when considered in conjunction with the accompanying drawings, in which.

DETAILED DESCRIPTION

Figure 1:
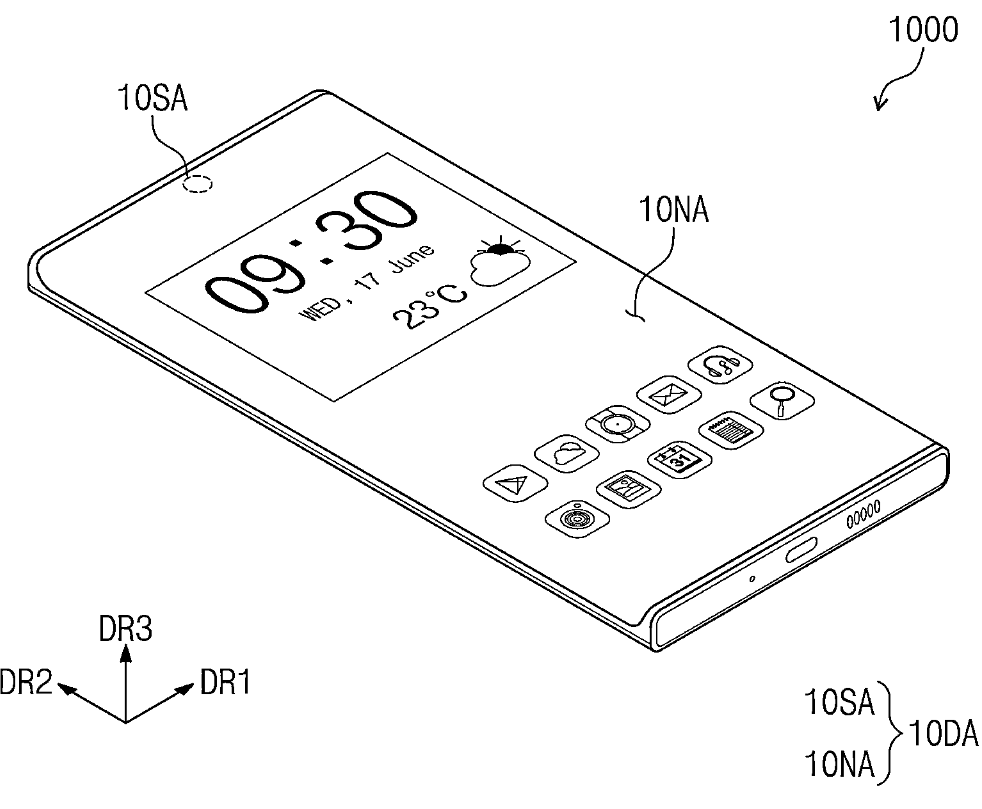
FIG. 1 is a perspective view of an electronic device according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the disclosure.

Spatially relative terms, such as "beneath", "below", "lower", "above", "upper" and the like, may be used herein for ease of description to describe one element or feature's relationship to another elements or features as shown in the figures.

It will be further understood that the terms "comprises" and/or "comprising," or "include" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the disclosure will be described in detail with reference to the accompanying drawings.

FIG. 1 is a perspective view of an electronic device 1000 according to an embodiment of the disclosure.

Referring to FIG. 1, an embodiment of the electronic device 1000 may be activated in response to electrical signals. The electronic device 1000 may be a mobile phone, a tablet computer, a monitor, a television set, a car navigation unit, a game unit, or a wearable device. FIG. 1 shows an embodiment where the electronic device 1000 is the mobile phone as a representative example, however, it should not be particularly limited.

The electronic device 1000 may display an image through an active area 10DA. The active area 10DA may include a plane defined by a first direction DR1 and a second direction DR2. The active area 10DA may include two curved surfaces respectively bent from at least two sides of the plane, however, the shape of the active area 10DA should not be limited thereto or thereby. In an embodiment, for example, the active area 10DA may include only the plane, or the active area 10DA may further include four curved surfaces respectively bent from four sides thereof.

The active area 10DA may include a first area 10SA and a second area 10NA. The electronic device 1000 may display the image through the first area 10SA and the second area 10NA. FIG. 1 shows an embodiment including a single first area 10SA as a representative example, however, the number of the first areas 10SA should not be limited thereto or thereby. The first area 10SA may be a portion of the active area 10DA and may have a light transmittance higher than that of the second area 10NA of the active area 10DA. The electronic device 1000 may receive and transmit an optical signal via the first area 10SA.

The electronic device 1000 may include an electro-optical module disposed in an area overlapping the first area 10SA. The electro-optical module may receive the optical signal provided from the outside via the first area 10SA or may output the optical signal via the first area 10SA. In an embodiment, for example, the electro-optical module may be a camera module, a sensor that measures a distance between an object and a mobile phone, such as a proximity sensor, or a small lamp that outputs a light, however, it should not be particularly limited.

A third direction DR3 may indicate a normal line direction of the active area 10DA, i.e., a thickness direction of the electronic device 1000. Front (or upper) and rear (or lower) surfaces of each member of the electronic device 1000 may be distinguished from each other with respect to the third direction DR3.

Figure 2A:
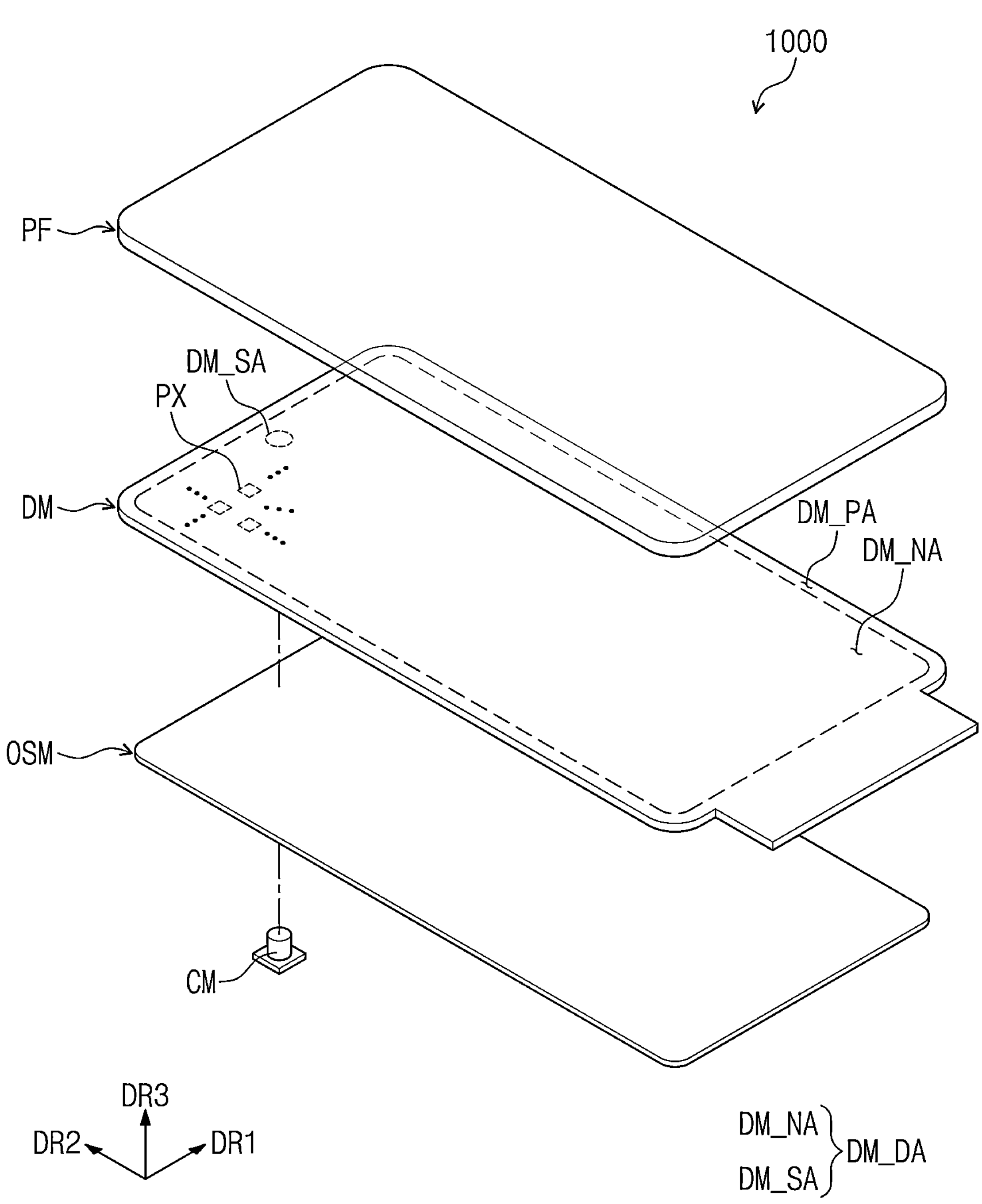
FIG. 2A is an exploded perspective view of some components of an electronic device according to an embodiment of the disclosure.

FIG. 2A is an exploded perspective view of some components of the electronic device according to an embodiment of the disclosure.

Referring to FIG. 2A, an embodiment of the electronic device 1000 may include a display module DM, an optical sensing module OSM, a camera module CM, and a protective film PF.

The display module DM may generate the image and may sense an input applied thereto from the outside. The display module DM may include a display area DM_DA through which the image is displayed and a peripheral area DM_PA defined adjacent to the display area DM_DA. In an embodiment, for example, the peripheral area DM_PA may be defined to surround the display area DM_DA, however, the disclosure should not be limited thereto or thereby. According to an embodiment, the peripheral area DM_PA may be provided adjacent to at least one side of the display area DM_DA. The image may not be displayed through the peripheral area DM_PA, and the peripheral area DM_PA may serve as a light blocking area that prevents a light from being output to the outside.

The display area DM_DA may include a first area DM_SA and a second area DM_NA. The first area DM_SA may overlap the first area 10SA of the electronic device 1000 shown in FIG. 1, and the second area DM_NA may overlap the second area 10NA of the electronic device 1000. The first area DM_SA may have a shape corresponding to the first area 10SA. The first area DM_SA may have a light transmittance higher than that of the second area DM_NA.

Figure 2B:
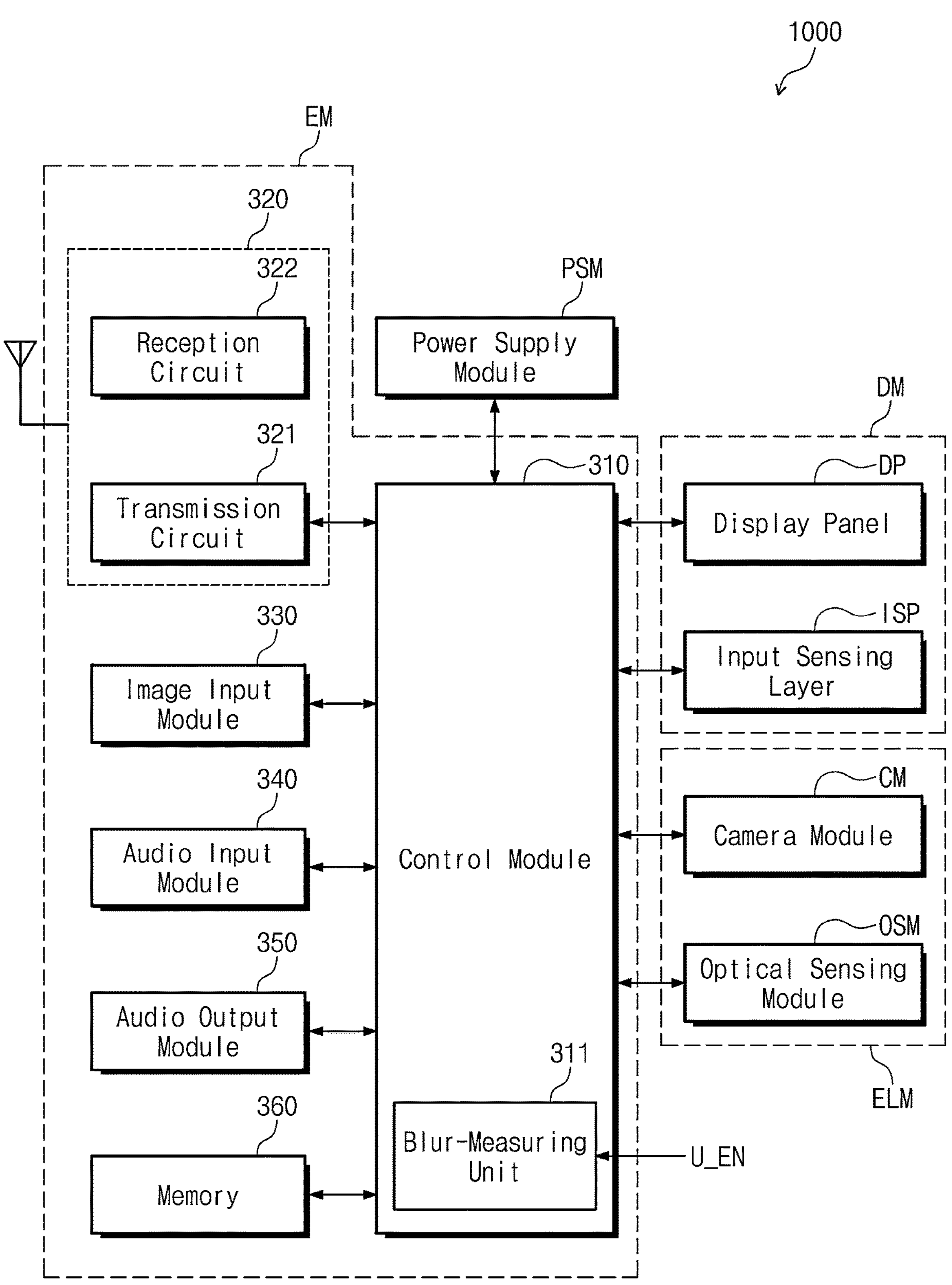
FIG. 2B is a block diagram of an electronic device according to an embodiment of the disclosure.

In an embodiment, for example, the display module DM may include a display panel DP (refer to FIG. 2B) and an input sensing layer ISP (refer to FIG. 2B). The display panel DP may include a plurality of pixels PX that substantially generates the image. Each of the pixels PX may include a light emitting element. That is, the display panel DP may be a light emitting type display panel. In an embodiment, for example, the display panel may be an organic light emitting display panel, an inorganic light emitting display panel, a quantum dot display panel, a micro-light emitting diode (LED) display panel, or a nano-LED display panel. The display panel DP may also be referred to as a display layer.

The input sensing layer ISP may be disposed on the display panel DP. The input sensing layer ISP may sense an external input applied thereto from the outside. The external input may be a user's input. The user's input may include various forms of external inputs, such as a touch by a part of the user's body, light, heat, pen, or pressure. The input sensing layer ISP may be formed on the display panel DP through successive processes.

In an embodiment, for example, the display module DM may further include a window and an anti-reflective film. The window may be disposed on the input sensing layer and may include an optically transparent insulating material. In an embodiment, for example, the window may include a glass or plastic material. The window may have a multi-layer structure or a single-layer structure. The anti-reflective film may be disposed between the window and the input sensing layer ISP and may reduce a reflectance with respect to an external light incident thereto from the above of the window.

The optical sensing module OSM may be disposed under the display module DM. The optical sensing module OSM may receive the optical signal exiting through the display module DM. In an embodiment, for example, the optical sensing module OSM may be a module that senses a user's fingerprint provided from the outside. The display area DM_DA of the display module DM may include a fingerprint recognition area defined therein. The fingerprint recognition area may be defined entirely over the display area DM_DA or a portion of the display area DM_DA. In an embodiment where the fingerprint recognition area is defined entirely over the display area DM_DA, the optical sensing module OSM may have a size corresponding to the display module DM.

The camera module CM may be disposed under the optical sensing module OSM. FIG. 2A shows an embodiment including a single camera module CM as a representative example, however, the number of the camera modules CM should not be limited thereto or thereby. The camera module CM may overlap the first area DM_SA of the display module DM when viewed in a plan view. Accordingly, the camera module CM may receive the optical signal incident thereto after passing through the first area DM_SA.

The protective film PF may be disposed on the display module DM. The protective film PF may protect the display module DM from external impacts. An adhesive may be disposed between the protective film PF and the display module DM.

FIG. 2B is a block diagram of the electronic device according to an embodiment of the disclosure.

Referring to FIG. 2B, an embodiment of the electronic device 1000 may include an electronic module EM, a power module PSM, the display module DM, and an optical module ELM.

The power module PSM may supply a power used for the overall operation of the electronic device 1000. The power module PSM may include a conventional battery device.

The display module DM may include the display panel DP and the input sensing layer ISP. The optical module ELM may include the optical sensing module OSM and the camera module CM.

The electronic module EM may include a control module 310, a wireless communication module 320, an image input module 330, an audio input module 340, an audio output module 350, and a memory 360. The modules 310, 320, 330, 340, 350, and 360 may be mounted on a circuit board to be electrically connected to each other or may be electrically connected to each other through a flexible circuit board. The electronic module EM may be electrically connected to the power module PSM.

The control module 310 may control the overall operation of the electronic device 1000. In an embodiment, for example, the control module 310 may activate or deactivate the display module DM in response to the user's input. The control module 310 may control other modules, such as the image input module 330, the audio input module 340, the audio output module 350, or the like, in response to the user's input. The control module 310 may include at least one microprocessor.

In an embodiment, for example, the control module 310 may include a blur-measuring unit 311. The blur-measuring unit 311 may measure a level of blur generated on the image due to the protective film PF (refer to FIG. 2A). A first image obtained through the optical sensing module OSM before the protective film PF is attached to the display module DM (i.e., in a state where the protective film PF is not attached to the display module DM) may be stored in the memory 360. The blur-measuring unit 311 may compare a second image obtained through the optical sensing module OSM after the protective film PF is attached to the display module DM with the first image and may calculate blur information of the second image. The calculated blur information may be stored in the memory 360. Accordingly, the control module 310 may compensate for image information obtained from the optical sensing module OSM based on the blur information.

In an embodiment, for example, the blur-measuring unit 311 may be activated by a user's operation (or instruction). In an embodiment, the control module 310 may receive an enable signal U_EN activated by the user's operation, and the blur-measuring unit 311 may be activated in response to the enable signal U_EN to perform an operation of measuring the blur information.

The wireless communication module 320 may transmit/receive a wireless signal to/from other terminals using a Bluetooth or WiFi link. The wireless communication module 320 may transmit/receive a voice signal using a general communication line. The wireless communication module 320 may include a transmission circuit 321 that modulates a signal to be transmitted and transmits the modulated signal and a reception circuit 322 that demodulates the signal applied thereto.

The image input module 330 may process an external image signal and may convert the external image signal into an image signal that may be displayed through the display module DM.

The audio input module 340 may receive an external sound signal through a microphone in a record mode or a voice recognition mode and may convert the external sound signal into electrical voice data.

The audio output module 350 may convert sound data provided thereto from the wireless communication module 320 or sound data stored in the memory 360 and may output the converted sound data.

Figure 3A:
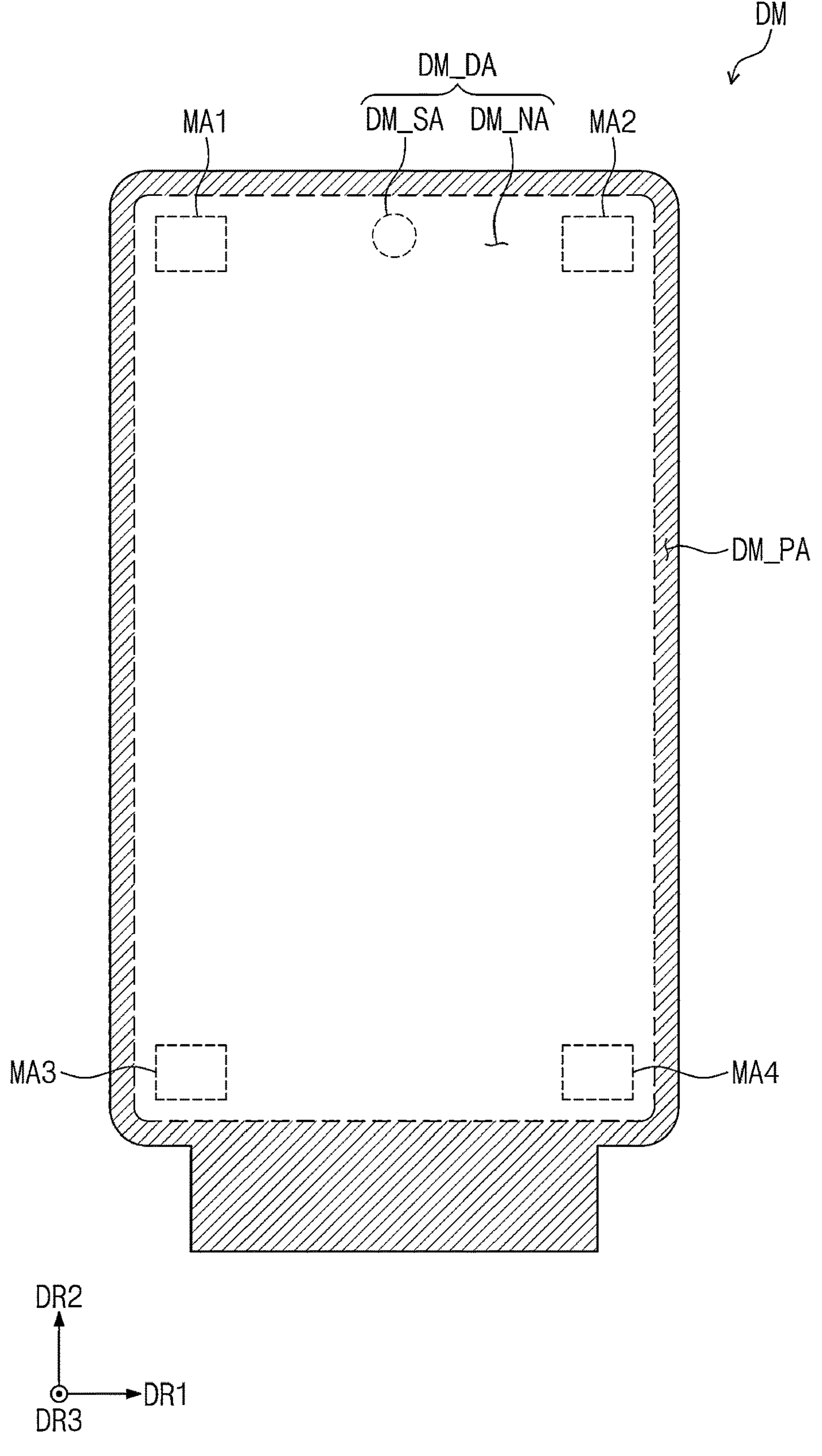
FIG. 3A is a plan view of a display module according to an embodiment of the disclosure.
Figure 3B:
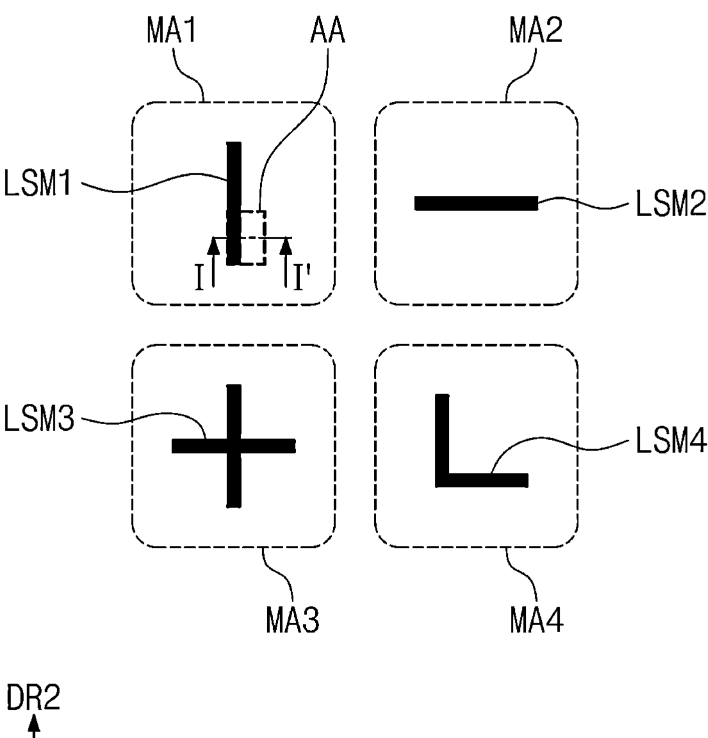
FIG. 3B is a plan view of first to fourth light blocking marks disposed in first to fourth measurement areas shown in FIG. 3A.

FIG. 3A is a plan view of the display module DM according to an embodiment of the disclosure, and FIG. 3B is a plan view of first to fourth light blocking marks disposed in first to fourth measurement areas shown in FIG. 3A.

Referring to FIG. 3A, an embodiment of the display module DM may include the display area DM_DA and the peripheral area DM_PA.

The display area DM_DA may include the first area DM_SA and the second area DM_NA. The first area DM_SA may have a circular shape, however, the shape of the first area DM_SA should not be limited thereto or thereby. The first area DM_SA may have another shape, such as a polygonal shape, an oval shape, a figure having at least one curved side, or an irregular shape. In an embodiment, for example, the first area DM_SA may be placed at an upper center portion of the display area DM_DA, however, the position of the first area DM_SA should not be limited thereto or thereby. Alternatively, the first area DM_SA may be disposed adjacent to one of both corners of an upper side of the display area DM_DA, for example, a right corner.

The first area DM_SA may be surrounded by the second area DM_NA, however, it should not be limited thereto or thereby. In an alternative embodiment, for example, the first area DM_SA may be partially surrounded by the second area DM_NA, and one side of the first area DM_SA may be in contact with the peripheral area DM_PA.

Referring to FIGS. 3A and 3B, at least one measurement area may be defined in a portion of the display area DM_DA, e.g., the second area DM_NA. A light blocking mark may be disposed on the measurement area. The light blocking mark may be a mark having a black color and a specific shape. FIGS. 3A and 3B show an embodiment where four measurement areas (hereinafter, referred to as the first, second, third, and fourth measurement areas) MA1, MA2, MA3, and MA4 are respectively disposed at four corners of the second area DM_NA as a representative example, however, the number and position of the measurement areas should not be limited thereto or thereby.

In an embodiment, for example, the first measurement area MA1 may be defined adjacent to an upper left corner portion of the second area DM_NA, and the second measurement area MA2 may be defined adjacent to an upper right corner portion of the second area DM_NA. In addition, the third measurement area MA3 may be disposed adjacent to a lower left corner portion of the second area DM_NA, and the fourth measurement area MA4 may be disposed adjacent to a lower right corner portion of the second area DM_NA.

First, second, third, and fourth light blocking marks LSM1, LSM2, LSM3, and LSM4 may be disposed in the first to fourth measurement areas MA1 to MA4, respectively. In an embodiment, for example, the first to fourth light blocking marks LSM1 to LSM4 are shown as having different shapes from each other, however, the disclosure should not be limited thereto or thereby. In an embodiment, for example, the first to fourth light blocking marks LSM1 to LSM4 may have substantially the same shape as each other, or at least two light blocking marks may have substantially the same shape as each other. In an embodiment, as shown in FIG. 3B, the first light blocking mark LSM1 may have a stripe structure extending in the second direction DR2, and the second light blocking mark LSM2 may have a stripe structure extending in the first direction DR1. In such an embodiment, the third light blocking mark LSM3 may have a cross shape, and the fourth light blocking mark LSM4 may have an L shape. However, the shape of each of the first to fourth light blocking marks LSM1 to LSM4 should not be limited thereto or thereby and each of the first to fourth light blocking marks LSM1 to LSM4 may have another shape, such as a circular shape, a quadrangular shape, a star shape, or the like.

Figure 4A:
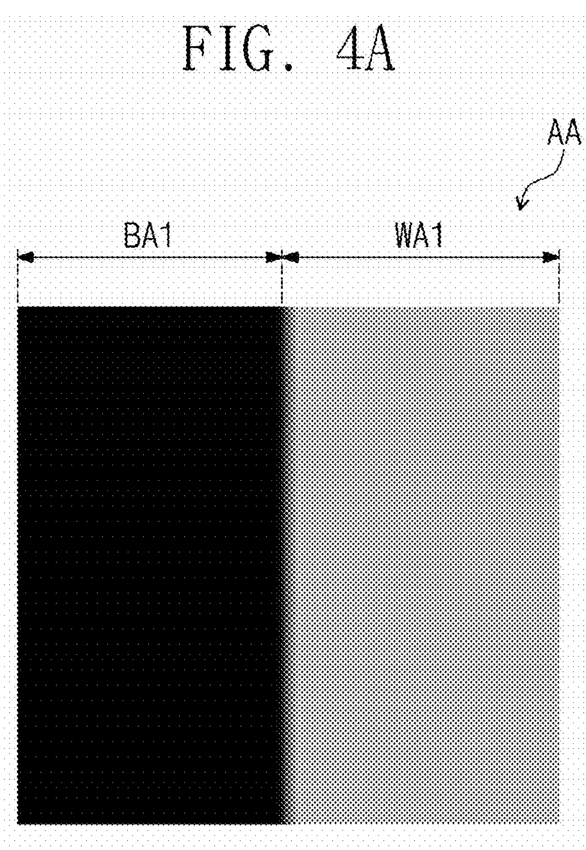
FIG. 4A is a view of a first image obtained from an area AA shown in FIG. 3B.
Figure 4B:
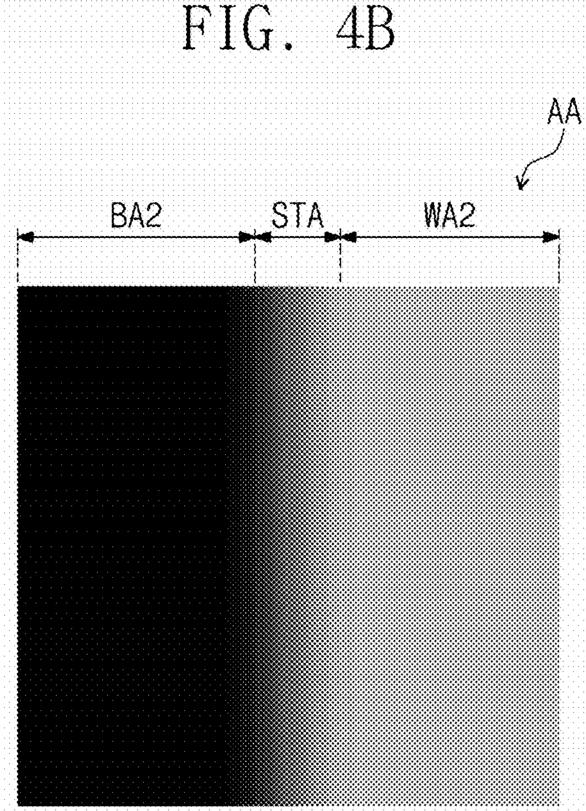
FIG. 4B is a view of a second image obtained from the area AA shown in FIG. 3B.

FIG. 4A is a view of a first image obtained from an area AA shown in FIG. 3B, and FIG. 4B is a view of a second image obtained from the area AA shown in FIG. 3B.

Referring to FIGS. 4A and 4B, the blur-measuring unit 311 (refer to FIG. 2B) may obtain the first image through the optical sensing module OSM in a state where the first to fourth light blocking marks LSM1 to LSM4 (refer to FIG. 3B) are respectively disposed on the first to fourth measurement areas MAT to MA4 (refer to FIG. 3B) before the protective film PF is attached to the display module DM. FIG. 4A shows a portion of the first image obtained from the area AA of the first measurement area MA1.

The blur-measuring unit 311 may obtain the second image through the optical sensing module OSM after the protective film PF (refer to FIG. 2A) is attached to the display module DM. FIG. 4B shows a portion of the second image obtained from the area AA of the first measurement area MA1.

The blur-measuring unit 311 may compare the second image with the first image and may calculate the blur information of the second image. The first image may include a first black portion BA1 and a first white portion WA1. The first black portion BA1 may correspond to the first light blocking mark LSM1, and the first white portion WA1 may not correspond to the first light blocking mark LSM1. That is, the first black portion BA1 may overlap the first light blocking mark LSM1 when viewed in a plan view, and the first white portion WAT may not overlap the first light blocking mark LSM1 when viewed in the plan view.

The second image may include a second black portion BA2, a second white portion WA2, and a blur portion STA. The second black portion BA2 may overlap the first light blocking mark LSM1 when viewed in the plan view, and the second white portion WA2 may not overlap the first light blocking mark LSM1 when viewed in the plan view. The blur portion STA may partially overlap the first light blocking mark LSM1 when viewed in the plan view and may be disposed between the second black portion BA2 and the second white portion WA2.

The blur-measuring unit 311 may calculate the blur information based on a difference in luminance between the first image and the second image.

Figure 5A:
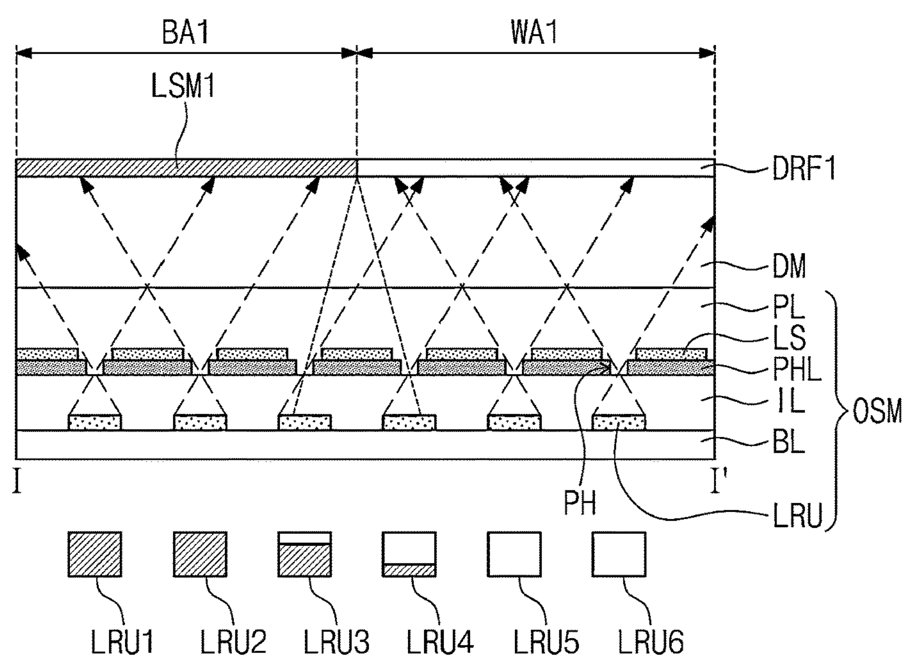
FIG. 5A is a cross-sectional view of a display module taken along line I-I' shown in FIG. 3B.
Figure 5B:
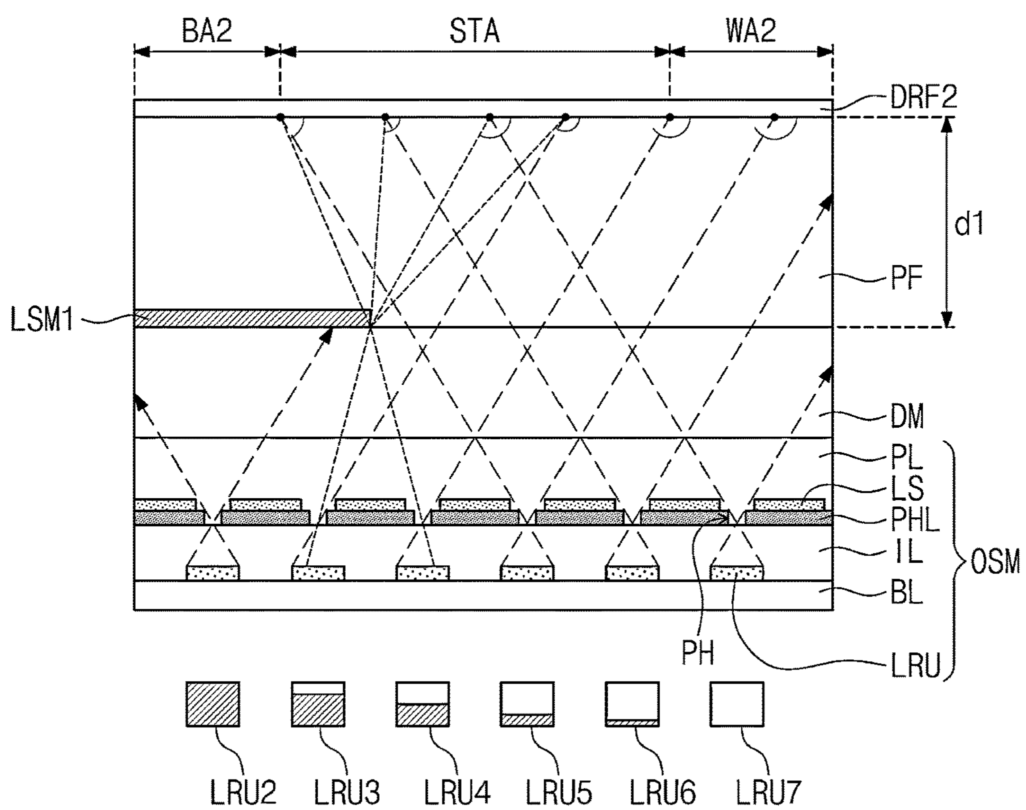
FIG. 5B is a cross-sectional view of a protective film disposed on the display module shown in FIG. 5A.

FIG. 5A is a cross-sectional view of the display module taken along line I-I' shown in FIG. 3B, and FIG. 5B is a cross-sectional view of the protective film disposed on the display module shown in FIG. 5A.

FIG. 5A shows a structure in which a first diffuse reflective film DRF1 is disposed on the display module DM, and FIG. 5B shows a structure in which a second diffuse reflective film DRF2 is disposed on the protective film PF.

Referring to FIG. 5A, the first diffuse reflective film DRF1 may not overlap the first light blocking mark LSM1 when viewed in the plan view, however, the disclosure should not be limited thereto or thereby. According to an alternative embodiment, the first diffuse reflective film DRF1 may overlap the first light blocking mark LSM1 when viewed in the plan view.

The optical sensing module OSM may be disposed under the display module DM. The optical sensing module OSM may include abase layer BL, an optical sensor LRU, an optical pattern layer PHL, and a light source layer LS.

The base layer BL may include a synthetic resin layer. The synthetic resin layer may be a polyimide-based resin layer, however, it should not be particularly limited.

The optical sensor LRU may be disposed on the base layer BL. The optical sensor LRU may be referred to as an optical sensor layer. The optical sensor LRU may be a sensor that reacts the optical signal incident thereto from the outside. In an embodiment, for example, the optical sensor LRU may be a photodiode, however, it should not be particularly limited. In an alternative embodiment, for example, the optical sensor LRU may be a phototransistor.

The optical pattern layer PHL may be disposed above the optical sensor LRU. In an embodiment, for example, the optical sensing module OSM may further include at least one insulating layer IL disposed between the optical pattern layer PHL and the optical sensor LRU. Alternatively, the insulating layer IL may be omitted. In such an embodiment, the optical pattern layer PHL may be directly disposed on the optical sensor LRU.

The optical pattern layer PHL may filter a light incident into the optical sensor LRU. In an embodiment, for example, an incident angle of the light exiting through the optical pattern layer PHL may be controlled by the optical pattern layer PHL. In an embodiment, for example, the incident angle may be limited to less than a predetermined angle. As the incident angle is limited, a light sensing performance of the optical sensor LRU may be improved.

The optical pattern layer PHL may include a light blocking material and may be provided with a plurality of pin holes PH defined thereinto correspond to the optical sensor LRU. Accordingly, only the light passing through the pin holes PH may be provided to the optical sensor LRU, and a remaining light may be blocked by the light blocking material of the optical pattern layer PHL.

The light source layer LS may be disposed on the optical pattern layer PHL and may output the light. FIGS. 5A and 5B show an embodiment having the structure in which the light source layer LS is disposed directly on the optical pattern layer PHL, however, the disclosure should not be limited thereto or thereby. In an alternative embodiment, for example, at least one insulating layer may be disposed between the light source layer LS and the optical pattern layer PHL. In an embodiment, the optical sensing module OSM may further include a protective layer PL disposed on the insulating layer IL to cover the light source layer LS and optical pattern layer PHL.

The light emitted from the light source layer LS may be absorbed by the first light blocking mark LSM1 or may be diffusely reflected to the optical pattern layer PHL by the first diffuse reflective film DRF1. The diffusely reflected light may be provided to the optical sensor LRU after passing through the pin holes PH.

FIG. 5A shows six optical sensors LRU. Among the six optical sensors, i.e., first to sixth optical sensors LRU1 to LRU6, the first, second, and third optical sensors LRU1, LRU2, and LRU3 may be disposed under the first light blocking mark LSM1, and the fourth, fifth, and sixth optical sensors LRU4, LRU5, and LRU6 may be disposed under the first diffuse reflective film DRF1.

As the first diffuse reflective film DRF1 and the first light blocking mark LSM1 are disposed right above the display module DM in FIG. 5A, blurs occur relatively infrequently or blurs hardly occur at a boundary between the first diffuse reflective film DRF1 and the first light blocking mark LSM1.

In this case, among the first, second, and third optical sensors LRU1, LRU2, and LRU3 disposed to correspond to the first light blocking mark LSM1, the first and second optical sensors LRU1 and LRU2 may receive substantially no light. Since the third optical sensor LRU3 is disposed at a boundary between the first light blocking mark LSM1 and the first diffuse reflective film DRF1, the third optical sensor LRU3 may receive more light than the first and second optical sensors LRU1 and LRU2.

In this case, among the fourth, fifth, and sixth optical sensors LRU4, LRU5, and LRU6 disposed to correspond to the first diffuse reflective film DRF1, the fifth and sixth optical sensors LRU5 and LRU6 may receive the light diffusely reflected by the first diffuse reflective film DRF1. Since the first diffuse reflective film DRF1 is disposed right above the display module DM, a distance between the first diffuse reflective film SRF1 and the optical sensing module OSM is small. Accordingly, only one optical sensor among the fourth, fifth, and sixth optical sensors LRU4, LRU5, and LRU6, i.e., the fourth optical sensor LRU4 adjacent to the boundary between the first light blocking mark LSM1 and the first diffuse reflective film DRF1, may receive less light than the fifth and sixth optical sensors LRU5 and LRU6.

Accordingly, as shown in FIGS. 4A and 5A, a phenomenon in which an amount of light provided to the optical sensor becomes higher or lower than a target light amount occurs in only two sensors (e.g., the third and fourth optical sensors LRU3 and LRU4) before the protective film is disposed, and thus, a boundary (i.e., an edge) between the first black portion BA1 and the first white portion WA1 may appear relatively clear.

In an embodiment where the protective film PF is disposed to cover the first light blocking mark LSM1 and the display module DM as shown in FIG. 5B, the blur phenomenon in which a boundary (i.e., an edge) between the second black portion BA2 and the second white portion WA2 is blurred may occur. The second image may be obtained through the optical sensing module OSM after placing the second diffuse reflective film DRF2 on the protective film PF in order to measure a level of blur, i.e., a blur amount. A distance dl between the display module DM and the second diffuse reflective film DRF2 may be determined by a thickness of the protective film PF, and as the thickness of the protective film PF increases, an area in which the blur occurs may increase.

As shown in FIG. 5B, among the fourth, fifth, sixth, and seventh optical sensors LRU4, LRU5, LRU6, and LRU7 disposed to correspond to the second diffuse reflective film DRF2, the fourth, fifth, and sixth optical sensors LRU4, LRU5, and LRU6 may receive a relatively small amount of light compared with that of the seventh optical sensor LRU7 due to an interference of the first light blocking mark LSM1. The reduction of the received light amount of the optical sensors LRU2 to LRU7 may decrease depending on a distance from the first light blocking mark LSM1. FIG. 5B shows a case where the received light amount of the seventh optical sensor LRU7 is not reduced since there is no interference of the first light blocking mark LSM1, however, the disclosure should not be limited thereto or thereby. In an embodiment, for example, the received light amount of the seventh optical sensor LRU7 may be reduced due to the interference, and optical sensors spaced farther apart from the first light blocking mark LSM1 than the seventh optical sensor LRU7 may be free from the above interference. The number of the optical sensors LRU2 to LRU6 in which the received light amount is reduced may be changed depending on a thickness of the protective film PF. That is, as the thickness of the protective film PF increases, the number of the optical sensors LRU2 to LRU7 in which the received light amount is reduced may increase, and thus, the area where the blur occurs may increase.

As described above, the phenomenon in which the amount of light provided to the optical sensor becomes higher or lower than the target light amount occurs in four sensors, i.e., the third to sixth optical sensors LRU3 to LRU6, after the protective film PF is disposed as shown in FIGS. 4B and 5B. Accordingly, the boundary (i.e., the edge) between the second black portion BA2 and the second white portion WA2 may be relatively blurred, and as a result, the blur portion STA may be formed between the second black portion BA2 and the second white portion WA2.

In a case where a sensing target is sensed or photographed using the optical sensing module OSM in the electronic device 1000 having the protective film PF, a distance between the sensing target and the optical sensing module OSM may increase by the protective film PF. In this case, the blur phenomenon occurs.

In an embodiment, the blur-measuring unit 311 may compare the first image with the second image and may measure the level of blur caused by the protective film PF. In an embodiment, for example, the blur-measuring unit 311 may subtract the light amount sensed by the first to seventh optical sensors LRU1 to LRU7 before the protective film PF is attached from the light amount sensed by the first to seventh optical sensors LRU1 to LRU7 after the protective film PF is attached to secure a difference value and may calculate the blur amount based on the difference value.

The electronic device 1000 may compensate for the image, which is obtained by sensing the sensing target through the optical sensing module OSM, using the extracted blur amount, and may generate the image from which the blur is removed. As a result, a sensing accuracy of the optical sensing module OSM may be improved.

Figure 6A:
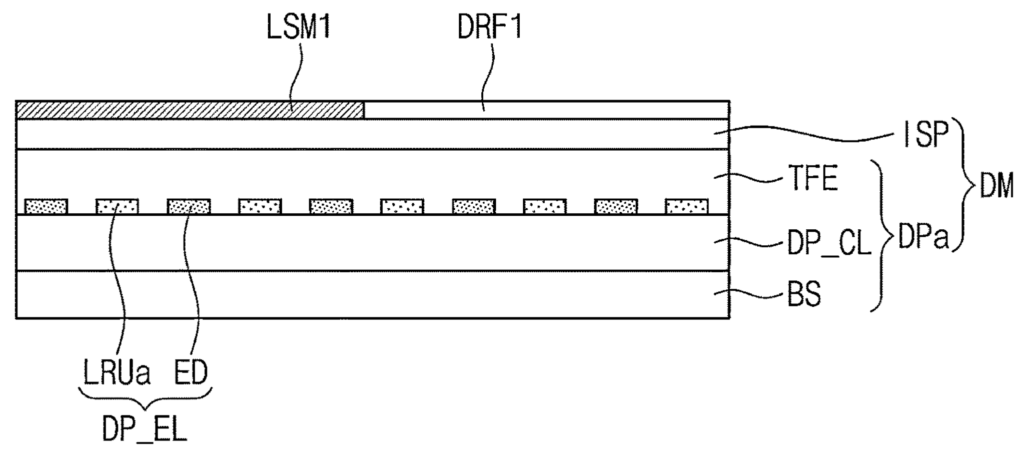
FIG. 6A is a cross-sectional view of a display module according to an embodiment of the disclosure.
Figure 6B:
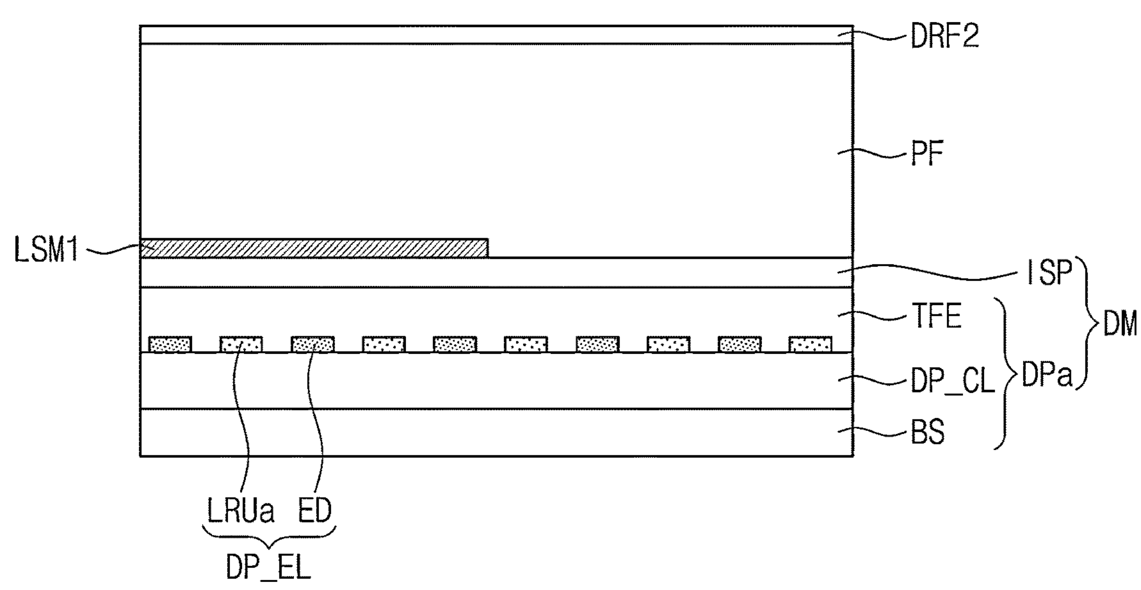
FIG. 6B is a cross-sectional view of a structure in which a protective film is disposed on the display module shown in FIG. 6A.

FIG. 6A is a cross-sectional view of a display module DM according to an embodiment of the disclosure, and FIG. 6B is a cross-sectional view of a structure in which a protective film PF is disposed on the display module shown in FIG. 6A.

Referring to FIGS. 6A and 6B, an embodiment of the display module DM may include a display panel DPa and an input sensing layer ISP. The display panel DPa may include a base substrate BS, a circuit layer DP_CL, a display element layer DP_EL, and an encapsulation layer TFE.

The base substrate BS may provide a base surface on which the circuit layer DP_CL is disposed. The base substrate BS may be a rigid substrate or a flexible substrate that is bendable, foldable, or rollable. The base substrate BS may be a glass substrate, a metal substrate, or a polymer substrate. However, the embodiment should not be limited thereto or thereby, and alternatively, the base substrate BS may be an inorganic layer, an organic layer, or a composite material layer.

The circuit layer DP_CL may be disposed on the base substrate BS. The circuit layer DP_CL may include an insulating layer, a semiconductor pattern, a conductive pattern, and a signal line. An insulating layer, a semiconductor layer, and a conductive layer may be formed on the base substrate BS by a coating or depositing process. Then, the insulating layer, the semiconductor layer, and the conductive layer may be selectively patterned through several photolithography processes. Thus, the semiconductor pattern, the conductive pattern, and the signal line included in the circuit layer DP_CL may be formed.

The display element layer DP_EL may be disposed on the circuit layer DP_CL. The display element layer DP_EL may include a plurality of light emitting elements ED and a plurality of optical sensors LRUa. The light emitting elements ED may correspond to the light emitting element disposed in each pixel PX (refer to FIG. 2A) of the display panel DPa. Each of the light emitting elements ED may include an organic LED, an inorganic LED, a micro-LED, or a nano-LED. When a light emitted from the light emitting elements ED is reflected by a sensing target, the optical sensors LRUa may sense the light reflected by the sensing target. In a case where the optical sensors LRUa are disposed in the display element layer DP_EL with the light emitting elements ED, the optical sensing module OSM (refer to FIG. 5A) disposed under the display module DM may be omitted, and in this case, the overall thickness of the electronic device 1000 and the number of components of the electronic device 1000 may be reduced.

The encapsulation layer TFE may be disposed on the display element layer DP_EL. The encapsulation layer TFE may protect the display element layer DP_EL from moisture, oxygen, and a foreign substance such as dust particles.

The input sensing layer ISP may be disposed on the display panel DPa. The input sensing layer ISP may sense an external input applied thereto from the outside. The external input may be a user's input. The user's input may include a variety of external inputs, such as a part of user's body, light, heat, pen, or pressure.

The input sensing layer ISP may be formed on the display panel DPa through successive processes. In this case, the input sensing layer ISP may be disposed directly on the display panel DPa. In the disclosure, the expression "the input sensing layer ISP is disposed directly on the display panel DPa" means that no intervening elements are present between the input sensing layer ISP and the display panel DPa. That is, a separate adhesive member may not be disposed between the input sensing layer ISP and the display panel DPa. According to an embodiment, the input sensing layer ISP may be coupled with the display panel DPa by an adhesive member. The adhesive member may include a conventional adhesive.

In a case where the sensing target is sensed or photographed using the optical sensor LRUa in the electronic device 1000 having the protective film PF, a distance between the sensing target and the optical sensor LRUa may increase by the protective film PF. In this case, the blur phenomenon occurs.

The blur-measuring unit 311 (refer to FIG. 2B) may compare a first image with a second image and may measure a level of blur caused by the protective film PF. In an embodiment, for example, the blur-measuring unit 311 may subtract the light amount sensed by the optical sensors LRUa before the protective film PF is attached from the light amount sensed by the optical sensors LRUa after the protective film PF is attached to obtain a difference value and may calculate the blur amount based on the difference value.

The electronic device 1000 may compensate for the image, which is obtained by sensing the sensing target through the optical sensors LRUa, using the calculated blur amount and may generate the image from which the blur is removed. As a result, a sensing accuracy of the optical sensors LRUa may be improved.

Figure 7:
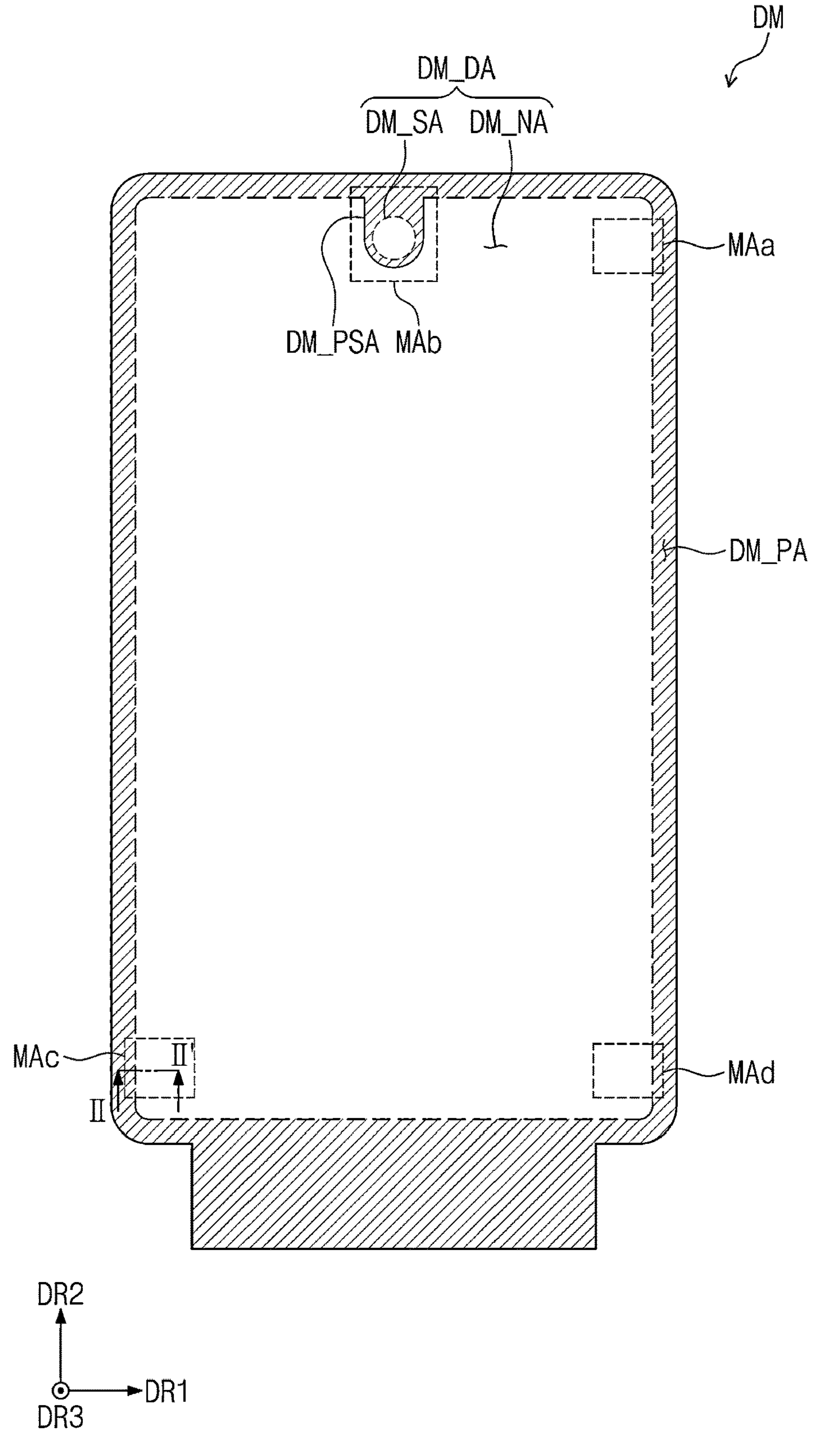
FIG. 7 is a plan view of a display module according to an embodiment of the disclosure.
Figure 8A:
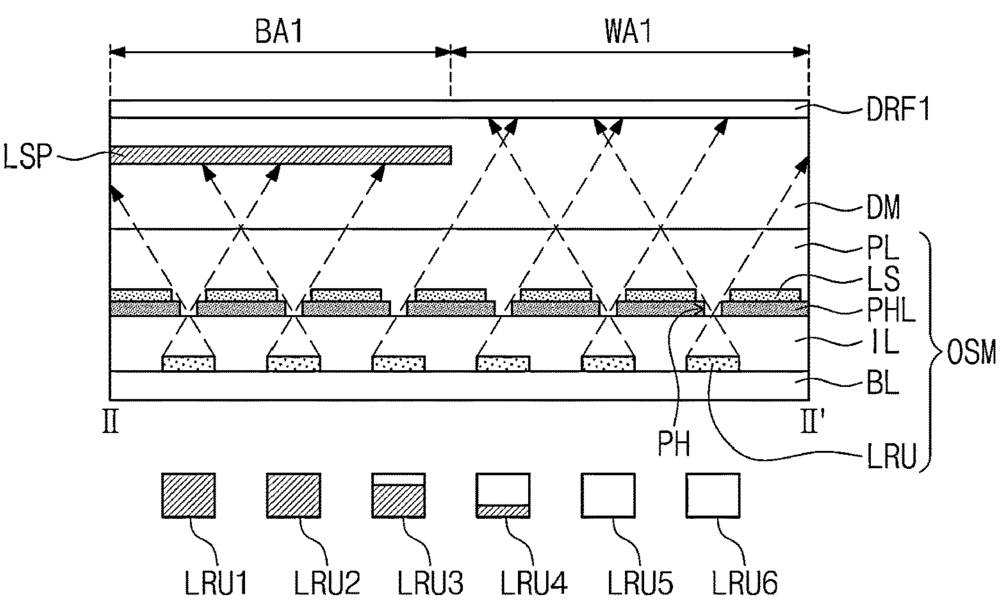
FIG. 8A is a cross-sectional view of a display module taken along line II-II' shown in FIG. 7.
Figure 8B:
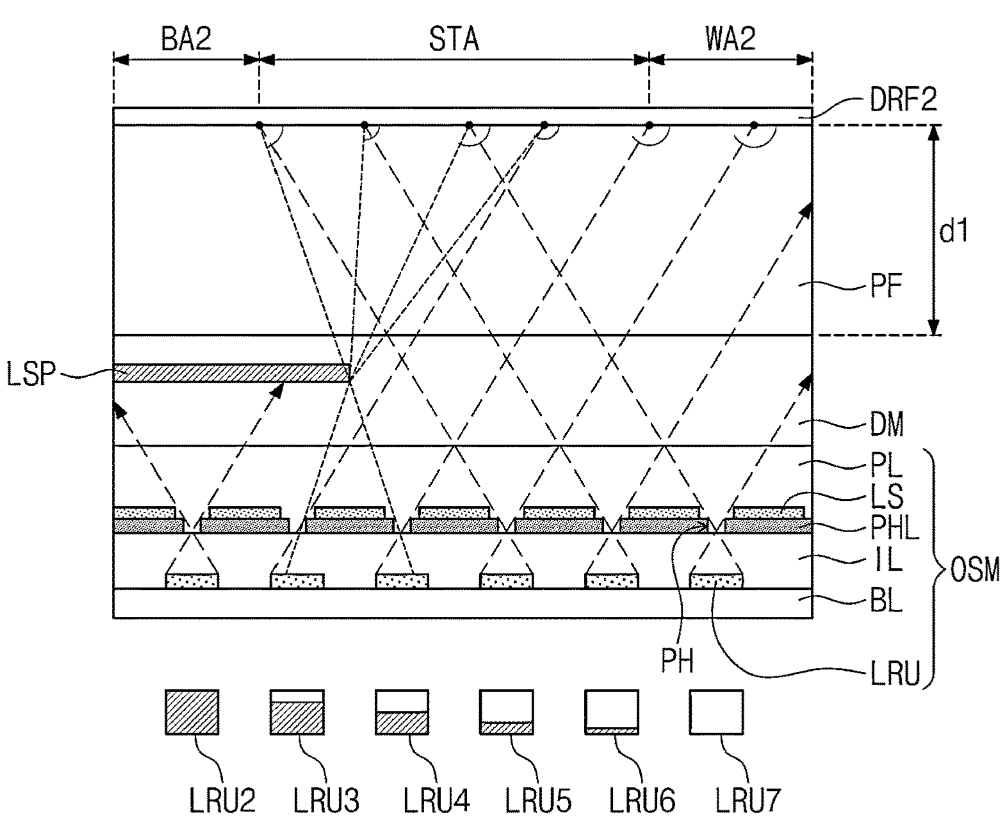
FIG. 8B is a cross-sectional view of a structure in which a protective film is disposed on the display module shown in FIG. 8A.

FIG. 7 is a plan view of a display module DM according to an embodiment of the disclosure. FIG. 8A is a cross-sectional view of the display module DM taken along line II-II' shown in FIG. 7, and FIG. 8B is a cross-sectional view of a structure in which a protective film is disposed on the display module DM shown in FIG. 8A.

Referring to FIG. 7, an embodiment of the display module DM may include a display area DM_DA and a peripheral area DM_PA.

The display area DM_DA may include a first area DM_SA and a second area DM_NA. In an embodiment, the first area DM_SA may have a circular shape, however, the shape of the first area DM_SA should not be limited thereto or thereby. The first area DM_SA may have another shape, such as a polygonal shape, an oval shape, a figure having at least one curved side, or an irregular shape.

The first area DM_SA may be surrounded by a sensing peripheral area DM_PSA. FIG. 7 shows an embodiment having a structure in which the sensing peripheral area DM_PSA is connected to the peripheral area DM_PA, however, the disclosure should not be limited thereto or thereby. Alternatively, the sensing peripheral area DM_PSA may be spaced apart from the peripheral area DM_PA. In such an embodiment, the sensing peripheral area DM_PSA may be surrounded by the second area DM_NA.

Referring to FIG. 7, at least one measurement area may be defined in the display module DM. The measurement area may partially overlap the sensing peripheral area or the peripheral area. In an embodiment, for example, four measurement areas (hereinafter, referred to as first, second, third, and fourth measurement areas MAa, MAb, MAc, and MAd) are defined in the display module DM, however, the position and the number of the measurement areas should not be particularly limited.

In an embodiment, for example, the first measurement area MAa may be defined adjacent to an upper right corner portion of the second area DM_NA and may overlap the peripheral area DM_PA, and the second measurement area MAb may be defined to overlap the sensing peripheral area DM_PSA at a center of the display area DM_DA in which the first area DM_SA is defined. In such an embodiment, the third measurement area MAc may be defined adjacent to a lower left corner portion of the second area DM_NA and may overlap the peripheral area DM_PA, and the fourth measurement area MAd may be defined adjacent to a lower right corner portion of the second area DM_NA and may overlap the peripheral area DM_PA.

Referring to FIGS. 8A and 8B, a light blocking pattern LSP may be disposed in the display module DM to correspond to the peripheral area DM_PA and the sensing peripheral area DM_PSA. The light blocking pattern LSP may be a window light blocking pattern disposed on a rear surface of a window or a black matrix disposed on the input sensing layer ISP (refer to FIG. 2B).

An optical sensing module OSM may include a plurality of optical sensors LRU, and a first portion of the optical sensors LRU may overlap the light blocking pattern LSP when viewed in the plan view. A second portion of the optical sensors LRU may not overlap the light blocking pattern LSP and may overlap the display area DM_DA when viewed in the plan view.

In an embodiment, as shown in FIG. 8A, a first diffuse reflective film DRF1 may be disposed on the display module DM. Since the first diffuse reflective film DRF1 is disposed right on the display module DM, a distance between the first diffuse reflective film DRF1 and the light blocking pattern LSP and a distance between the first diffuse reflective film DRF1 and the optical sensing module OSM may be relatively small. Accordingly, blurs occur relatively infrequently or blurs hardly occur at a boundary between the second area DM_NA and the peripheral area DM_PA.

In such an embodiment, among first, second, and third optical sensors LRU1, LRU2, and LRU3 disposed to correspond to (i.e., to overlap) the light blocking pattern LSP, the first and second optical sensors LRU1 and LRU2 may receive substantially no light. Since the third optical sensor LRU3 is disposed adjacent to a boundary between the light blocking pattern LSP and the first diffuse reflective film DRF1, the third optical sensor LRU3 may receive more light than the first and second optical sensors LRU1 and LRU2.

In such an embodiment, among fourth, fifth, and sixth optical sensors LRU4, LRU5, and LRU6 disposed to correspond to the first diffuse reflective film DRF1, the fifth and sixth optical sensors LRU5 and LRU6 may receive the light diffusely reflected by the first diffuse reflective film DRF1. That is, the fourth, fifth, and sixth optical sensors LRU4, LRU5, and LRU6 may not overlap the light blocking pattern LSP when viewed in the plan view. Among the fourth, fifth, and sixth optical sensors LRU4, LRU5, and LRU6, the fourth optical sensor LRU4 may be disposed adjacent to the boundary between the first light blocking mark LSM1 and the first diffuse reflective film DRF1 and thus may receive less light than the fifth and sixth optical sensors LRU5 and LRU6. The received light amount of the optical sensors LRU1 to LRU6 may be reduced depending on a distance from the light blocking pattern LSP.

Accordingly, as shown in FIGS. 4A and 8A, since a distance between the first diffuse reflective film DRF1 and the optical sensing module OSM is small before the protective film PF is disposed, a phenomenon in which an amount of light provided to the optical sensor becomes higher or lower than a target light amount occurs in only two sensors (e.g., the third and fourth optical sensors LRU3 and LRU4), and a boundary (i.e., the edge) between a first black portion BA1 and a first white portion WA1 may appear relatively clear.

However, in a case where the protective film PF is disposed to cover the display module DM as shown in FIG. 8B, the blur phenomenon in which a boundary (i.e., the edge) between a second black portion BA2 and a second white portion WA2 is blurred may occur. A second image may be obtained through the optical sensing module OSM after placing a second diffuse reflective film DRF2 on the protective film PF in order to measure the level of blur, i.e., a blur amount. A distance dl between the display module DM and the second diffuse reflective film DRF2 may be determined by a thickness of the protective film PF, and as the thickness of the protective film PF increases, an area in which the blur occurs may increase.

As shown in FIG. 8B, among fourth, fifth, sixth, and seventh optical sensors LRU4, LRU5, LRU6, and LRU7 disposed to correspond to the second diffuse reflective film DRF2, the fourth, fifth, and sixth optical sensors LRU4, LRU5, and LRU6 may receive a relatively small amount of light compared with that of the seventh optical sensor LRU7 due to an interference of a light blocking pattern LSP. Although FIG. 8B shows an embodiment where the received light amount of the seventh optical sensor LRU7 is not reduced since there is no interference of the light blocking pattern LSP, the disclosure should not be limited thereto or thereby. In an embodiment, for example, the received light amount of the seventh optical sensor LRU7 may be reduced due to the interference, and optical sensors spaced farther apart from the light blocking pattern LSP than the seventh optical sensor LRU7 may be free from the above interference.

As described above, the phenomenon in which the amount of light provided to the optical sensor becomes higher or lower than the target light amount may occur in four sensors, i.e., the third to sixth optical sensors LRU3 to LRU6, after the protective film PF is disposed as shown in FIG. 8B. Accordingly, the boundary (i.e., the edge) between the second black portion BA2 and the second white portion WA2 may be relatively blurred, and as a result, a blur portion STA may be formed between the second black portion BA2 and the second white portion WA2.

In a case where a sensing target is sensed or photographed using the optical sensing module OSM in the electronic device 1000 having the protective film PF, a distance between the sensing target and the optical sensing module OSM may increase by the protective film PF. In this case, the blur phenomenon occurs.

The blur-measuring unit 311 (refer to FIG. 2B) may compare a first image with the second image and may measure the level of blur caused by the protective film PF. In an embodiment, for example, the blur-measuring unit 311 may subtract the light amount sensed by the second to sixth optical sensors LRU21 to LRU6 before the protective film PF is attached from the light amount sensed by the second to sixth optical sensors LRU2 to LRU6 after the protective film PF is attached to secure a difference value and may calculate the blur amount based on the difference value.

The electronic device 1000 may compensate for the image, which is obtained by the optical sensing module OSM that senses the sensing target, using the extracted blur amount, and may generate the image from which the blur is removed. As a result, a sensing accuracy of the optical sensing module OSM may be improved.

Figure 9A:
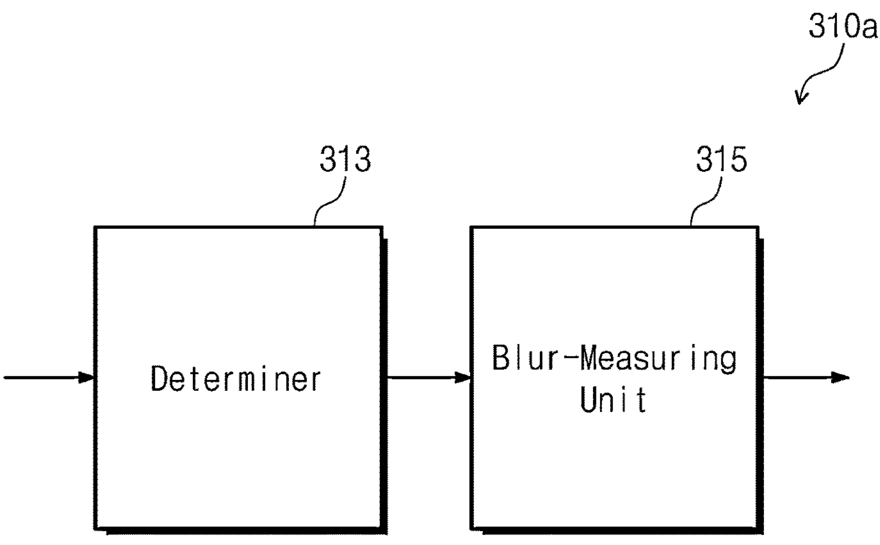
FIG. 9A is a block diagram of a control module according to an embodiment of the disclosure.

FIG. 9A is a block diagram of a control module **310*a* according to an embodiment of the disclosure, and FIG. 9**B is a perspective view showing a state of an electronic device according to an embodiment of the disclosure.

Figure 9B:
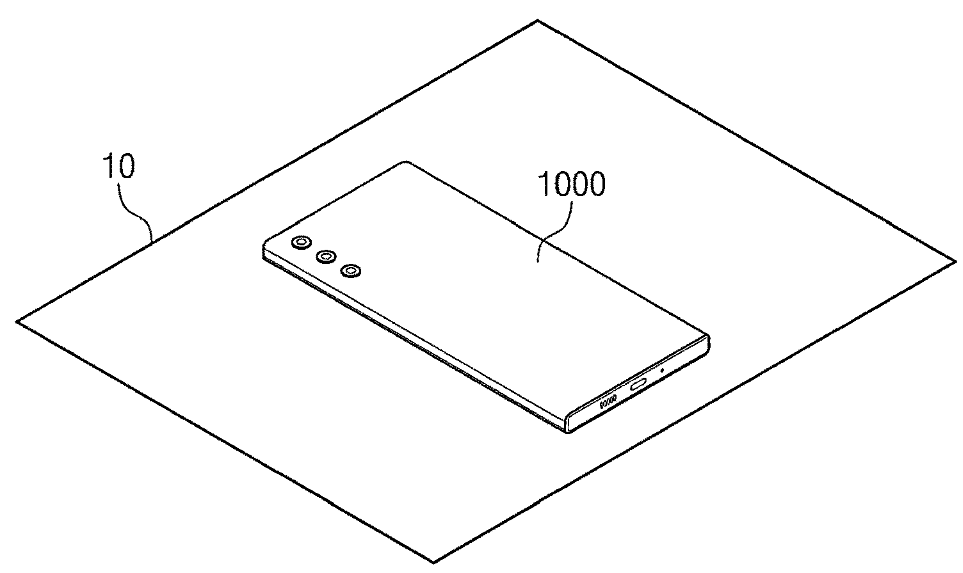
FIG. 9B is a perspective view of an electronic device according to an embodiment of the disclosure.

Referring to FIGS. 9A and 9B, an embodiment of the control module **310*a* may include a determiner 313 and a blur-measuring unit 315. The determiner 313 may determine whether a state of the electronic device 1000 meets a blur measuring condition. Accordingly, the blur-measuring unit 315 may be activated based on the determined result of the determiner 313 and may measure blur information. In this case, the blur-measuring unit 315 may not receive the enable signal U_EN (refer to FIG. 2**B) that is activated by a user's operation.

The determiner 313 may determine whether a luminance of a reference image obtained from a predetermined reference area of the display area DM_DA (refer to FIG. 3A) is included in a predetermined reference range, and when the luminance of the reference image is included in the reference range, the determiner 313 may determine that the state of the electronic device 1000 meets the blur measuring condition. In an embodiment, for example, the expression "the state of the electronic device 1000 meets the blur measuring condition" may mean that the electronic device 1000 is placed on a diffuse reflective target 10, such as a white wallpaper or a white desk, that replaces the second diffuse reflective film DRF2 (refer to FIG. 5B). In particular, the determiner 313 may recognize that the electronic device 1000 is placed upside down on the diffuse reflective target 10 using an acceleration sensor.

When it is determined that the luminance of the reference image is not included in the reference range based on the determined result, the determiner 313 may determine that the state of the electronic device 1000 does not meet the blur measuring condition. That is, even though the electronic device 1000 is placed upside down, it may be determined that the electronic device 1000 is placed on not the diffuse reflective target 10 but a general target, i.e., a target that does not have the diffuse reflective function.

When it is determined that the state of the electronic device 1000 meets the blur measuring condition based on the determined result of the determiner 313, the determiner 313 may provide an activation signal to the blur-measuring unit 315 to activate the blur-measuring unit 315. Since the operation of measuring the blur information of the blur-measuring unit 315 is described with reference to FIGS. 2B to 8B, any repetitive detailed descriptions thereof will be omitted.

As described above, in an embodiment where the control module **310*a* includes the determiner 313, the electronic device 1000** may automatically perform the blur measuring operation without the user's operation.

Figure 10:
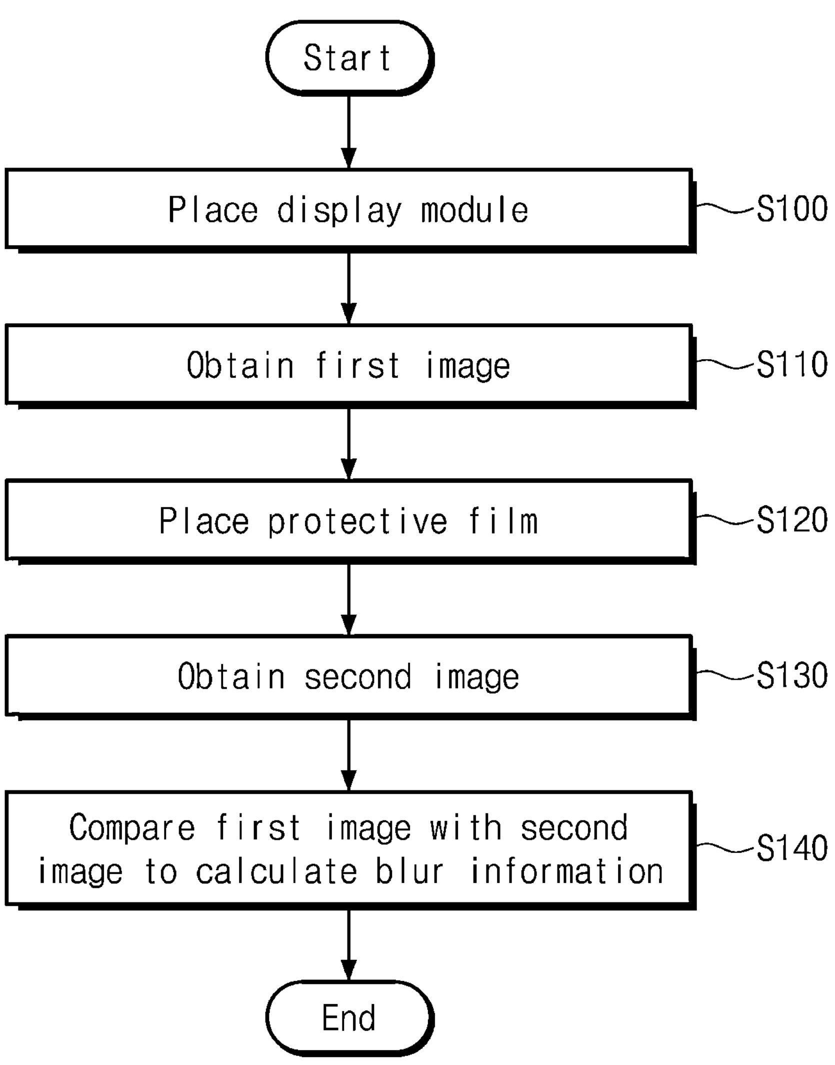
FIGS. 10 and 11 are flowcharts of a method of measuring blur information of an electronic device according to an embodiment of the disclosure.
Figure 11:
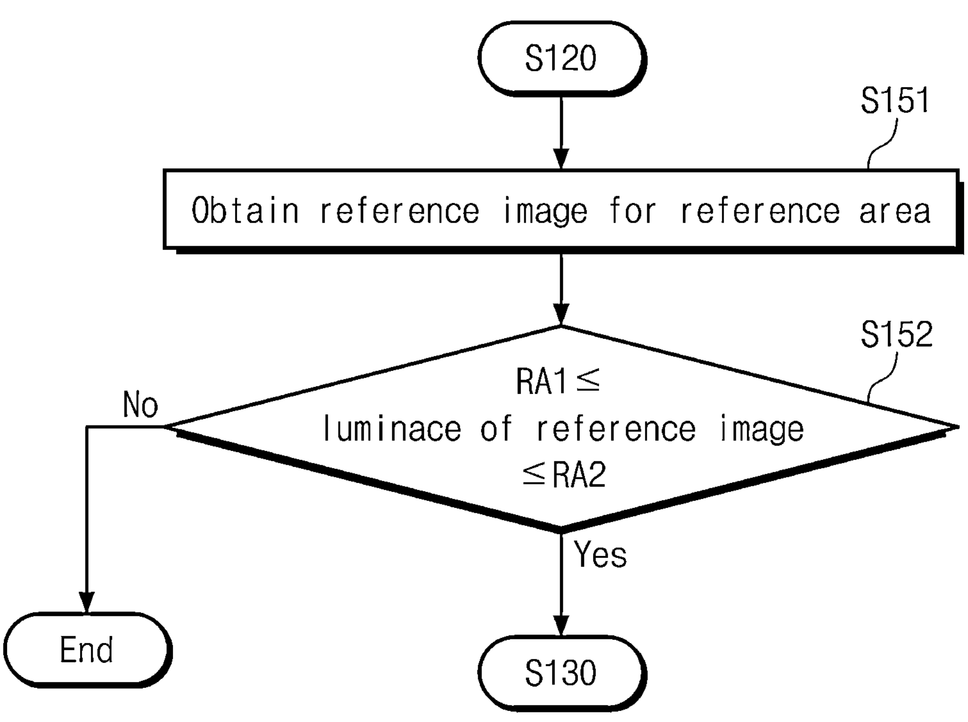

FIGS. 10 and 11 are flowcharts of a method of measuring blur information of the electronic device according to an embodiment of the disclosure.

Referring to FIGS. 2B, 3A, 10, and 11, an embodiment of the method of measuring the blur information of the electronic device 1000 may include placing the display module DM (S100). The display module DM may include the display area DM_DA through which the image is displayed and the peripheral area DM_PA defined adjacent to the display area DM_DA. At least one measurement area MA1 to MA4 may be defined in display area DM_DA.

The electronic device 1000 may obtain the first image with respect to the measurement areas MA1 to MA4 of the display module DM using the optical sensing module OSM disposed under the display module DM (S110). The obtained first image may be stored in the memory 360.

Before the obtaining of the first image, placing the light blocking marks LSM1 to LSM4 (refer to FIG. 3B) above the measurement areas MA1 to MA4 of the display module DM may be further performed. The light blocking marks LSM1 to LSM4 may be disposed to overlap the display area DM_DA when viewed in a plan view.

Then, the protective film PF may be disposed on the display module DM (S120). The blur-measuring unit 311 may obtain the second image with respect to the measurement areas MA1 to MA4 using the optical sensing module OSM after placing the protective film PF (S130). The blur-measuring unit 311 may compare the second image with the first image to calculate the blur information of the second image (S140).

Before the obtaining of the first image, the first diffuse reflective film DRF1 (refer to FIG. 5A) may be disposed on the display module DM and the light blocking marks LSM1 to LSM4. In addition, before the obtaining of the second image, the second diffuse reflective film DRF2 (refer to FIG. 5B) may be disposed on the protective film PF. In an embodiment, for example, the first image may be the image obtained using the optical signal reflected by the first diffuse reflective film DRF1, and the second image may be the image obtained using the optical signal reflected by the second diffuse reflective film DRF2.

In an embodiment, for example, the blur information measuring method of the electronic device 1000 may further include determining whether the electronic device 1000 is in the state that meets the blur measuring condition before the obtaining of the second image. In this case, the obtaining of the second image may be activated based on the determined result.

The determining whether the state of the electronic device 1000 meets the blur measuring condition may include obtaining the reference image for the predetermined reference area of the display area (S151) and determining whether the luminance of the reference image obtained from the predetermined reference area of the display area is included in a predetermined reference range of RA1 to RA2 (i.e., RA1≤luminance of reference image RA2)≤(S152). The electronic device 1000 determines that the state of the electronic device 1000 meets the blur measuring condition when the luminance of the reference image is included in the reference range of RA1 to RA2 and determines that the state of the electronic device 1000 does not meet the blur measuring condition when the luminance of the reference image is not included in the reference range of RA1 to RA2 (S152).

In embodiments of the invention, As described above, as the electronic device 1000 automatically determines whether the state of the electronic device 1000 meets the blur measuring condition using the determiner 313 (refer to FIG. 9A), the blur measuring operation may be automatically performed without the user's operation.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. An electronic device comprising:

a display module comprising a display area, through which an image is displayed, and a peripheral area defined adjacent to the display area;

an optical sensing module disposed under the display module, wherein the optical sensing module receives an optical signal via the display module;

a protective film disposed on the display module; and a control module comprising a blur-measuring unit which compares a first image obtained using the optical sensing module before the protective film is attached to the display module with a second image obtained using the optical sensing module after the protective film is attached to the display module to calculate blur information included in the second image, wherein the first image is obtained in a state where a light blocking mark and a first diffuse reflective film are disposed on the display module, and the second image is obtained in a state where the light blocking mark is disposed on the display module and a second diffuse reflective film is disposed on the protective film, wherein the first diffuse reflective film does not overlap the light blocking mark when viewed in the plan view.

2. The electronic device of claim 1, wherein the optical sensing module comprises a plurality of optical sensors, and the optical sensors overlap the display area.

3. The electronic device of claim 2, wherein the first image comprises:

a first black portion overlapping the light blocking mark when viewed in a plan view; and a first white portion which does not overlap the light blocking mark when viewed in the plan view, and the second image comprises:

a second black portion overlapping the light blocking mark when viewed in the plan view;

a second white portion which does not overlap the light blocking mark when viewed in the plan view; and a blur portion partially overlapping the light blocking mark and disposed between the second black portion and the second white portion when viewed in the plan view.

4. The electronic device of claim 3, wherein the blur-measuring unit calculates the blur information based on a difference in luminance between the first image and the second image.

5. The electronic device of claim 2, wherein the optical sensing module further comprises a light source disposed above the optical sensors to emit a light, and the light is provided to the optical sensors as the optical signal after being reflected by the first diffuse reflective film or the second diffuse reflective film.

6. An electronic device comprising:

a display module comprising a display area, through which an image is displayed, and a peripheral area defined adjacent to the display area;

an optical sensing module disposed under the display module, wherein the optical sensing module receives an optical signal via the display module;

a protective film disposed on the display module; and a control module comprising a blur-measuring unit which compares a first image obtained using the optical sensing module before the protective film is attached to the display module with a second image obtained using the optical sensing module after the protective film is attached to the display module to calculate blur information included in the second image, wherein the display area comprises a first area and a second area having a light transmittance lower than a light transmittance of the first area, the display module further comprises a sensing peripheral area defined adjacent to the first area, and the display module comprises a light blocking pattern disposed in the peripheral area and the sensing peripheral area.

7. The electronic device of claim 6, wherein the optical sensing module comprises a plurality of optical sensors, a first portion of the optical sensors overlaps the light blocking pattern when viewed in a plan view, and a second portion of the optical sensors overlaps the display area when viewed in the plan view.

8. The electronic device of claim 1, wherein the control module receives an enable signal activated by a user's operation, and the blur-measuring unit is activated in response to the enable signal to measure the blur information.

9. The electronic device of claim 1, wherein the control module further comprises a determiner that determines whether a state of the electronic device meets a blur measuring condition, and the blur-measuring unit is activated based on a determined result of the determiner to measure the blur information.

10. The electronic device of claim 9, wherein the determiner determines whether a luminance of a reference image obtained from a predetermined reference area of the display area is included in a predetermined reference range, determines that the state of the electronic device meets the blur measuring condition when the luminance of the reference image is included in the reference range, and determines that the state of the electronic device does not meet the blur measuring condition when the luminance of the reference image is not included in the reference range.

11. A method of measuring blur information of an electronic device, the method comprising:

placing a display module comprising a display area through which an image is displayed and a peripheral area defined adjacent to the display area;

obtaining a first image with respect to a measurement area of the display module using an optical sensing module disposed under the display module;

placing a protective film on the display module;

obtaining a second image with respect to the measurement area using the optical sensing module in a state where the protective film is attached to the display module; and comparing the second image with the first image to calculate the blur information included in the second image, further comprising:

placing a light blocking mark on the display module before the obtaining the first image and the placing the protective film on the display module;

placing a first diffuse reflective film on the display module before the obtaining the first image; and placing a second diffuse reflective film on the protective film before the obtaining the second image, wherein the light blocking mark is disposed to overlap the display area when viewed in a plan view, wherein the first image is obtained using an optical signal reflected by the first diffuse reflective film, and the second image is obtained using an optical signal reflected by the second diffuse reflective film.

12. The method of claim 11, wherein the first image comprises:

a first black portion overlapping the light blocking mark when viewed in the plan view; and a first white portion that does not overlap the light blocking mark when viewed in the plan view, and the second image comprises:

a second black portion overlapping the light blocking mark when viewed in the plan view;

a second white portion which does not overlap the light blocking mark when viewed in the plan view; and a blur portion partially overlapping the light blocking mark and disposed between the second black portion and the second white portion when viewed in the plan view, and wherein the blur information is calculated based on a difference in luminance between the first image and the second image.

13. A method of measuring blur information of an electronic device, the method comprising:

placing a display module comprising a display area through which an image is displayed and a peripheral area defined adjacent to the display area;

obtaining a first image with respect to a measurement area of the display module using an optical sensing module disposed under the display module;

placing a protective film on the display module;

obtaining a second image with respect to the measurement area using the optical sensing module in a state where the protective film is attached to the display module; and comparing the second image with the first image to calculate the blur information included in the second image, wherein the display area comprises a first area and a second area having a light transmittance lower than a light transmittance of the first area, the display module further comprises a sensing peripheral area defined adjacent to the first area, the display module comprises a light blocking pattern disposed in the peripheral area and the sensing peripheral area, the optical sensing module comprises a plurality of optical sensors, a first portion of the optical sensors overlaps the light blocking pattern when viewed in a plan view, and a second portion of the optical sensors overlaps the display area when viewed in the plan view.

14. The method of claim 13, further comprising:

placing a first diffuse reflective film on the display module before the obtaining the first image; and placing a second diffuse reflective film on the protective film before the obtaining the second image, wherein the first image is obtained using an optical signal reflected by the first diffuse reflective film, and the second image is obtained using an optical signal reflected by the second diffuse reflective film.

15. The method of claim 14, wherein the first image comprises:

a first black portion overlapping the light blocking pattern when viewed in the plan view; and a first white portion that does not overlap the light blocking pattern when viewed in the plan view, and the second image comprises:

a second black portion overlapping the light blocking pattern when viewed in the plan view;

a second white portion that does not overlap the light blocking pattern when viewed in the plan view; and a blur portion partially overlapping the light blocking pattern and disposed between the second black portion and the second white portion when viewed in the plan view, and wherein the blur information is calculated based on a difference in luminance between the first image and the second image.

16. The method of claim 11, further comprising:

determining whether a state of the electronic device meets a blur measuring condition before the obtaining the second image, wherein the obtaining the second image is activated based on a result of the determining.

17. The method of claim 16, wherein the determining whether the state of the display module meets the blur measuring condition comprises:

determining whether a luminance of a reference image obtained from a predetermined reference area of the display area is included in a predetermined reference range;

determining that the state of the electronic device meets the blur measuring condition when the luminance is included in the reference range; and determining that the state of the electronic device does not meet the blur measuring condition when the luminance is not included in the reference range.

* * * * *